(12) United States Patent
Sasaki et al.

(10) Patent No.: US 10,943,631 B2
(45) Date of Patent: Mar. 9, 2021

(54) SPIN CURRENT MAGNETIZATION REVERSING ELEMENT, MAGNETORESISTANCE EFFECT ELEMENT, MAGNETIC MEMORY, AND MAGNETIC DEVICE

(71) Applicant: TDK CORPORATION, Tokyo (JP)

(72) Inventors: Tomoyuki Sasaki, Tokyo (JP); Yohei Shiokawa, Tokyo (JP); Jiro Yoshinari, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/114,692

(22) Filed: Aug. 28, 2018

(65) Prior Publication Data

US 2019/0074043 A1 Mar. 7, 2019

(30) Foreign Application Priority Data

Sep. 4, 2017 (JP) .............................. JP2017-169735
Aug. 27, 2018 (JP) .............................. JP2018-158294

(51) Int. Cl.
*G11C 11/16* (2006.01)
*G01R 33/09* (2006.01)
(Continued)

(52) U.S. Cl.
CPC .......... *G11C 11/161* (2013.01); *G01R 33/093* (2013.01); *G01R 33/098* (2013.01);
(Continued)

(58) Field of Classification Search
CPC ... G11C 11/161; G11C 11/18; G11C 11/1675; H01L 43/08; H01L 43/14; H01L 43/10;
(Continued)

(56) References Cited

U.S. PATENT DOCUMENTS

| 4,737,416 A | * | 4/1988 | Akoh | .................... C04B 37/026 |
| | | | | 204/192.17 |
| 4,814,581 A | * | 3/1989 | Nunogaki | ............... F23Q 7/001 |
| | | | | 219/270 |

(Continued)

FOREIGN PATENT DOCUMENTS

| JP | 2012-038815 A | 2/2012 |
| WO | 2016/021468 A1 | 2/2016 |

OTHER PUBLICATIONS

Shunsuke Fukami et al. "Magnetization Switching by Spin-Orbit Torque in an Antiferromagnet-Ferromagnet Bilayer System". Nature Materials, May 2016, vol. 15, pp. 535-542.
(Continued)

*Primary Examiner* — Marcos D. Pizarro
*Assistant Examiner* — Sue Tang
(74) *Attorney, Agent, or Firm* — Oliff PLC

(57) ABSTRACT

A spin current magnetization reversing element (100) includes a spin orbit torque wiring layer (101) that extends in one direction, a first ferromagnetic layer (102) that is formed on a first surface (101*a*) of the spin orbit torque wiring layer, and a first insulating layer (103) that is formed on a second surface (101*b*) on a side opposite to the first ferromagnetic layer (102) side on the surface of the spin orbit torque wiring layer. The first insulating layer (103) contains boron nitride or aluminum nitride.

10 Claims, 4 Drawing Sheets

(51) Int. Cl.
*H01L 43/04* (2006.01)
*H01L 43/08* (2006.01)
*H01L 43/10* (2006.01)
*H01L 43/14* (2006.01)
*H01L 43/06* (2006.01)
*G11C 11/18* (2006.01)
*H01L 43/02* (2006.01)

(52) U.S. Cl.
CPC .......... *G11C 11/1675* (2013.01); *G11C 11/18* (2013.01); *H01L 43/02* (2013.01); *H01L 43/04* (2013.01); *H01L 43/06* (2013.01); *H01L 43/08* (2013.01); *H01L 43/10* (2013.01); *H01L 43/14* (2013.01)

(58) Field of Classification Search
CPC ....... H01L 43/04; H01L 43/06; G01R 33/098; G01R 33/093
See application file for complete search history.

(56) References Cited

U.S. PATENT DOCUMENTS

| | | | |
|---|---|---|---|
| 8,350,347 | B2 | 1/2013 | Gaudin et al. |
| 9,337,078 | B2* | 5/2016 | Gambino ........... H01L 21/76224 |
| 2003/0193756 | A1* | 10/2003 | Kudo ...................... G11B 5/313 |
| | | | 360/313 |
| 2008/0164547 | A1* | 7/2008 | Higo ...................... B82Y 10/00 |
| | | | 257/421 |
| 2009/0209050 | A1* | 8/2009 | Wang ...................... H01L 43/12 |
| | | | 438/3 |
| 2012/0032288 | A1 | 2/2012 | Tomioka |
| 2013/0230741 | A1* | 9/2013 | Wang .................. H01F 10/3272 |
| | | | 428/826 |
| 2015/0079401 | A1* | 3/2015 | Ohno .................... H01L 23/145 |
| | | | 428/416 |
| 2015/0348606 | A1 | 12/2015 | Buhrman et al. |
| 2016/0225423 | A1* | 8/2016 | Naik ....................... H01L 43/08 |
| 2017/0222135 | A1 | 8/2017 | Fukami et al. |
| 2018/0005746 | A1* | 1/2018 | Thomas ................ H01F 10/123 |

OTHER PUBLICATIONS

Y.K. Kato et al. "Observation of the Spin Hall Effect in Semiconductors". Science Magazine, Dec. 10, 2004, vol. 306, pp. 1910-1913.
Ioan Mihai Miron et al. "Perpendicular Switching of a Single Ferromagnetic Layer Induced by In-Plane Current Injection". Nature, Aug. 11, 2011, vol. 476, pp. 189-194.
Luqiao Liu et al. "Spin Torque Switching With the Giant Spin Hall Effect of Tantalum". Science Magazine, 2012, vol. 336, pp. 1-19 and vol. 555, pp. 1-12.
Luqiao Liu et al. "Current-Induced Switching of Perpendicularly Magnetized Magnetic Layers Using Spin Torque From the Spin Hall Effect". Physical Review Letters, Aug. 31, 2012, vol. 109, pp. 096602-1 through 096602-5.
Ki-Seung Lee et al. "Threshold Current for Switching of a Perpendicular Magnetic Layer Induced by Spin Hall Effect". Applied Physics Letters, 2013, vol. 102, pp. 112410-1 through 112410-5.
Ki-Seung Lee et al. "Thermally Activated Switching of Perpendicular Magnet by Spin-Orbit Spin Torque". Applied Physics Letters, 2014, vol. 104, pp. 072413-1 through 072413-5.
S. Fukami et al. "A Spin-Orbit Torque Switching Scheme With Collinear Magnetic Easy Axis and Current Configuration". Nature Nanotechnology, 2016, vol. 11, pp. 1-6.
S. Takahashi et al. "Spin Injection and Detection in Magnetic Nanostructures". Physical Review 3, 2003, vol. 67, pp. 052409-1 through 052409-4.
Yeongkyo Seo et al. "Area-Efficient SOT-MRAM With a Schottky Diode". IEEE Electron Device Letters, Aug. 2016, vol. 37, No. 8, pp. 982-985.
Wei Zhang et al. "Spin Hall Effects in Metallic Antiferromagnets". Physical Review Letters, Nov. 7, 2014, vol. 113, pp. 196602-1 through 196602-6.

* cited by examiner

SPIN CURRENT MAGNETIZATION REVERSING ELEMENT, MAGNETORESISTANCE EFFECT ELEMENT, MAGNETIC MEMORY, AND MAGNETIC DEVICE

TECHNICAL FIELD

Field of the Invention

The disclosure relates to a spin current magnetization reversing element, a magnetoresistance effect element, a magnetic memory, and a magnetic device.

Priority is claimed on Japanese Patent Application No. 2017-169735, filed Sep. 4, 2017 and Priority is claimed on Japanese Patent Application No. 2018-158294, filed Aug. 27, 2018, the content of which is incorporated herein by reference.

Background Art

A giant magnetoresistance (GMR) element including a multilayered film of a ferromagnetic layer and a nonmagnetic layer and a tunneling magnetoresistance (TMR) element using an insulating layer (a tunnel barrier layer, a barrier layer) as a nonmagnetic layer are known. In general, a TMR element has higher electric resistance than a GMR element, but has a higher magnetoresistance (MR) ratio than a GMR element. Accordingly, TMR elements have attracted attention as a magnetic sensor, a high-frequency component, a magnetic head, and a nonvolatile RAM (MRAM) element.

These magnetoresistance effect elements have a structure in which a nonmagnetic layer is interposed between two ferromagnetic layers having different coercive forces, and reading and writing of data thereon can be performed using characteristics in which electric resistance varies depending on an angle formed by a magnetization direction of one ferromagnetic layer and a magnetization direction of the other ferromagnetic layer. A writing method (a magnetization reversing method) using a magnetic field formed by a current or a writing method (a magnetization reversing method) using a spin transfer torque (STT) which is generated by causing a current to flow in a stacking direction of a magnetoresistance effect element is known as a writing method of an MRAM. Magnetization reversal of a TMR element using an STT is efficient in view of energy efficiency, but a reversing current density for reversing magnetization is high. In order to improve durability of a TMR element, it is preferable that the reversing current density be as low as possible. This point is true of a GMR element.

Recently, it has been proposed that magnetization reversal using a pure spin current which is generated by spin orbit interaction is possible in application (for example, see Non-Patent Document 1). A pure spin current based on the spin orbit interaction induces a spin orbit torque (SOT) and causes magnetization reversal due to the SOT. A pure spin current is generated by causing the same number of electrons with an upward spin and the same number of electrons with a downward spin to flow reversely, and flows of electric charges based on the pure spin current are cancelled out. Accordingly, a current flowing in a magnetoresistance effect element is zero and the magnetoresistance effect element is not damaged by the pure spin current.

PRIOR ART LITERATURE

Patent Document

[Patent Document 1] Japanese Unexamined Patent Application, First Publication No. 2012-38815

Non-Patent Document

[Non-Patent Document 1] S. Fukami, C. Zhang, S. Dutta Gupta, A. Kurenkov and H. Ohno, Nature materials (2016). DOI: 10.1038/NMAT4566

SUMMARY OF THE INVENTION

Problems to be Solved by the Invention

In order to generate a pure spin current, a magnetoresistance effect element using an SOT includes a spin orbit torque wiring layer that extends in one direction. Although the spin orbit torque wiring layer is mainly formed of a heavy metal element, the spin orbit torque wiring layer has high electric resistance because of its long shape and emits a large amount of heat with its current flowing therein. Emission of heat from the spin orbit torque wiring layer may cause disconnection thereof and facilitates magnetization reversal of a ferromagnetic layer, but causes deterioration of characteristics such as deterioration of a nonmagnetic layer, dissolution of a wiring layer formed of a metal with a low melting point, or destabilization of magnetization of a fixed layer.

A configuration in which boron nitride, which is known as an element having high heat dissipation, is used as a side wall of a ferromagnetic layer is disclosed in Patent Document 1. However, as described above, in the spin current magnetization reversing element using an SOT, since the spin orbit torque wiring layer serves as a heat source, it is difficult to satisfactorily curb emission of heat from the spin orbit torque wiring layer even when the heat dissipation of the side wall of the ferromagnetic layer is increased.

The disclosure is made in consideration of the above-mentioned circumstances and an objective thereof is to provide a spin current magnetization reversing element, a magnetoresistance effect element, a magnetic memory, and a magnetic device that have a structure in which disconnection of a spin orbit torque wiring layer and deterioration of characteristics due to emission of heat are not easily caused.

Means for Solving the Problems

The disclosure provides the following means in order to achieve the above-mentioned objective.

(1) A spin current magnetization reversing element according to an aspect of the disclosure includes: a spin orbit torque wiring layer that extends in one direction; a first ferromagnetic layer that is formed on a first surface of the spin orbit torque wiring layer; and a first insulating layer that is formed on a second surface on a side opposite to the first ferromagnetic layer side on the surface of the spin orbit torque wiring layer, and the first insulating layer contains boron nitride or aluminum nitride.

(2) In the spin current magnetization reversing element according to (1), a second insulating layer containing silicon nitride as a major component may be formed on one surface other than the second surface of the spin orbit torque wiring layer.

(3) In the spin current magnetization reversing element according to (1) or (2), the first insulating layer may contain silicon nitride as a major component.

(4) In the spin current magnetization reversing element according to any one of (1) to (3), the boron nitride or the aluminum nitride is in a grain form and a plurality of grains made of the boron nitride or the aluminum nitride are distributed in the first insulating layer.

(5) In the spin current magnetization reversing element according to any one of (1) to (4), a heat-dissipating layer may be formed on a surface on a side opposite to the first insulating layer side and a surface on a side opposite to the second insulating layer side on the surface of the spin orbit torque wiring layer.

(6) In the spin current magnetization reversing element according to any one of (1) to (5), the heat-dissipating layer may contain a metal nitride as a major component.

(7) A magnetoresistance effect element according to an aspect of the disclosure includes: the spin current magnetization reversing element according to any one of (1) to (6); a nonmagnetic layer; and a second ferromagnetic layer, and the nonmagnetic layer and the second ferromagnetic layer are sequentially formed in a part on a side opposite to the spin orbit torque wiring layer side on the surface of the first ferromagnetic layer in the spin current magnetization reversing element.

(8) In the magnetoresistance effect element according to (7), a cap layer containing MgO or $AB_2O_4$ (A=Mg or Zn, B=Al, Ga, or In) having a spinel structure is provided on a surface on a side opposite to the nonmagnetic layer side on the surface of the second ferromagnetic layer.

(9) In the magnetoresistance effect element according to (7) or (8), a semiconductor element may be additionally formed on a surface on a side opposite to the spin orbit torque wiring layer side on the surface of the first insulating layer.

(10) A magnetic memory according to an aspect of the disclosure includes the magnetoresistance effect element according to any one of (7) to (9).

(11) In a magnetic device according to an aspect of the disclosure, the magnetic memory according to (10) is mounted as a built-in memory in an LSI substrate.

Effects of the Invention

According to the disclosure, a part of the surface of the spin orbit torque wiring layer constituting the spin current magnetization reversing element is coated with the first insulating layer with improved heat dissipation by containing boron nitride. Accordingly, even when a large current flows in the spin orbit torque wiring layer, it is possible to efficiently dissipate heat generated with a current to the outside via the first insulating layer. Accordingly, it is possible to provide a spin current magnetization reversing element, a magnetoresistance effect element, a magnetic memory, and a magnetic device that have a structure in which disconnection of a spin orbit torque wiring layer and deterioration of characteristics due to emission of heat are not easily caused.

EMBODIMENTS FOR CARRYING OUT THE INVENTION

Figure 1:
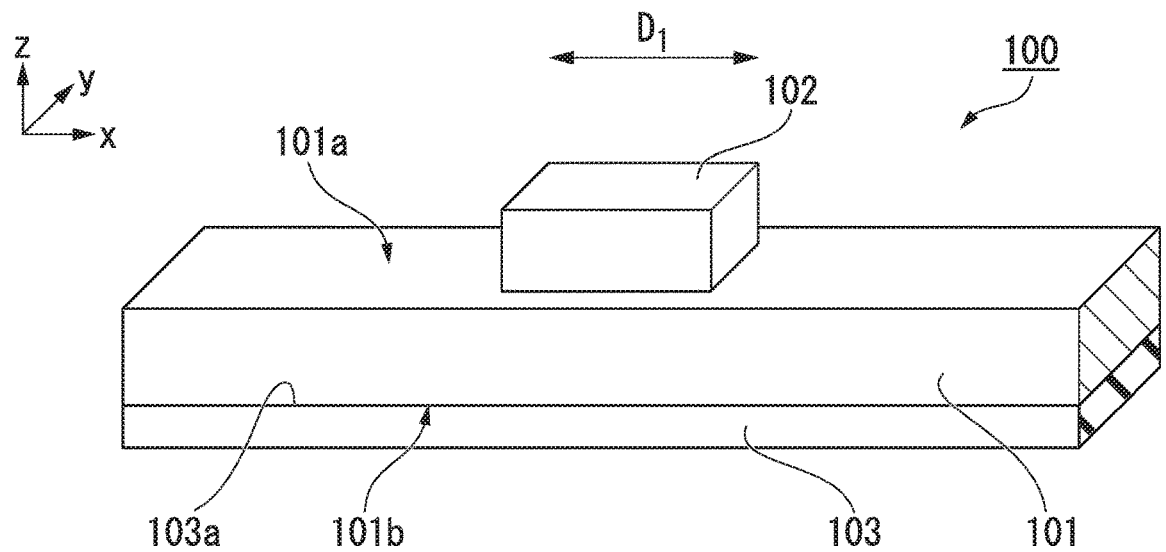
FIG. 1 is a perspective view schematically illustrating a configuration of a spin current magnetization reversing element according to a first embodiment of the disclosure.

Hereinafter, the disclosure will be described in detail with reference to the accompanying drawings. In the drawings used for the following description, feature parts may be enlarged for the purpose of convenience and dimensional proportions of elements or the like may be different from actual values. Materials, dimensions, and the like which will be described in the following description are examples, and the disclosure is not limited thereto and can be appropriately modified as long as advantageous effects of the disclosure are achieved. An element according to the disclosure may include another layer as long as the advantageous effects of the disclosure are achieved.

First Embodiment (Spin Current Magnetization Reversing Element)

FIG. 1 is a perspective view schematically illustrating a configuration of a spin current magnetization reversing element 100 according to a first embodiment of the disclosure. The spin current magnetization reversing element 100 includes a spin orbit torque wiring layer 101 that extends in one direction $D_1$, a first ferromagnetic layer 102 that is formed on a first surface 101a of the spin orbit torque wiring layer, and a first insulating layer 103 that is formed on a second surface 101b on a side opposite to the first ferromagnetic layer 102 side on the surface of the spin orbit torque wiring layer 101.

The spin current magnetization reversing element 100 is an element that reverses magnetization of a ferromagnetic layer using a spin orbit torque (SOT) based on a pure spin current, and can be assembled into a magnetoresistance effect element which will be described later for use. On the other hand, the spin current magnetization reversing element 100 may be used as assist devices or main devices for reversing magnetization of a ferromagnetic metal layer in a magnetoresistance effect element using an STT in the related art. The spin current magnetization reversing element 100 may be independently used as an anisotropic magnetic sensor or an optical element using a magnetic Kerr effect or a magnetic Faraday effect.

The first ferromagnetic layer 102 is formed of a known material having ferromagnetism, for example, a metal selected from the group consisting of Cr, Mn, Co, Fe, and Ni and a ferromagnetic alloy containing one or more types of these metals. The first ferromagnetic layer 102 may be formed of an alloy (specifically, Co—Fe or Co—Fe—B) containing the metals and one or more types of the elements B, C, and N.

In order to obtain a higher output, it is preferable that a Heusler alloy such as $Co_2FeSi$ be used. The Heusler alloy contains an intermetallic compound having a chemical composition of $X_2YZ$. Here, X is a transition metal element or a precious metal element in the Co, Fe, Ni, or Cu group, Y is a transition metal in the Mn, V, Cr, or Ti group or the same element as X, and Z is a typical element of Groups III to V. For example, $Co_2FeSi$, $Co_2MnSi$, or $Co_2Mn_{1-a}Fe_aAl_bSi_{1-b}$ can be used as the Heusler alloy.

It is preferable that the first ferromagnetic layer 102 have an insertion layer (not illustrated) containing at least one of Ta, W, Mo, Cr, Ru, Rh, Ir, Pd, and Pt therein. Since the insertion layer has a function of absorbing B, the insertion layer can prevent B from diffusing from the first ferromagnetic layer 102 to the spin orbit torque wiring layer 101 and prevent a composition ratio of the spin orbit torque wiring layer 101 from being disturbed. The insertion layer can provide vertical magnetic anisotropy to the first ferromagnetic layer 102 due to its interfacial magnetic anisotropy.

The insertion layer may serve as a base layer of the first ferromagnetic layer, which greatly contributes to a magnetoresistance effect. The magnetoresistance effect is larger when the first ferromagnetic layer 102 is crystal-oriented via the insertion layer than when the first ferromagnetic layer is crystal-oriented from above the amorphous or microcrystalline spin orbit torque wiring layer.

The insertion layer may be disposed at any position in the first ferromagnetic layer 102. The insertion layer may be disposed in an interface with the spin orbit torque wiring layer 101 and a thickness thereof preferably ranges from 0.1 nm to 2.5 nm.

Figure 2:
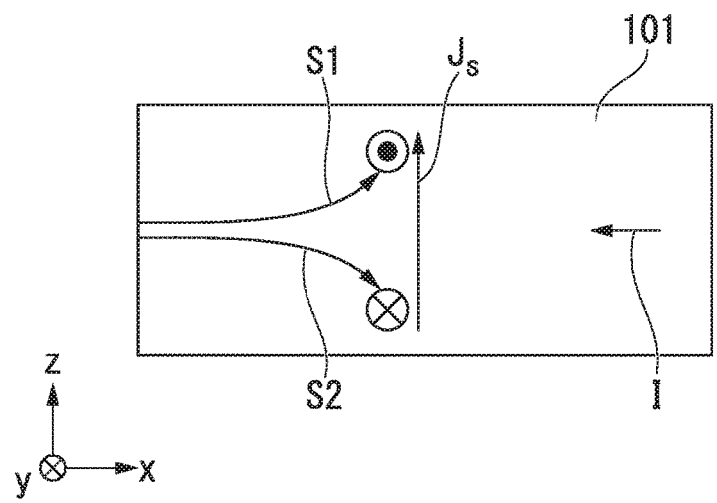
FIG. 2 is a schematic diagram illustrating a spin Hall effect.

FIG. 2 is a schematic diagram illustrating a spin Hall effect which is caused in the spin orbit torque wiring layer 101 illustrated in FIG. 1 and is a sectional view of the spin orbit torque wiring layer 101 taken in an x direction. A mechanism in which a pure spin current is generated due to the spin Hall effect will be described below with reference to FIG. 2.

As illustrated in FIG. 2, when a current I flows in the extending direction (the –x direction) of the spin orbit torque wiring layer 101, a first spin S1 oriented in the –y direction and a second spin S2 oriented in the +y direction are turned in directions perpendicular to the direction of the current I. A normal Hall effect and a spin Hall effect are common in that moving (migrating) electric charges (electrons) turn their moving (migrating) directions. They are greatly different from each other in that the normal Hall effect occurs only when a magnetic field is present, but the spin Hall effect is caused by migration of electrons due to an internal field generated from collapse of space reflection symmetry without a magnetic field.

In a nonmagnetic substance (a material other than a ferromagnetic substance), since the number of electrons with the first spin S1 and the number of electrons with the second spin S2 are the same, the number of electrons with the first spin S1 which is oriented upward and the number of electrons with the second spin S2 which is oriented downward are the same. Accordingly, a current as a net flow of electric charges is zero. A spin current not accompanied with a current is specifically referred to as a pure spin current.

When a current flows in a ferromagnetic substance, the first spin S1 and the second spin S2 are the same in that they are turned in the opposite directions. On the other hand, in a ferromagnetic substance, one of the number of electrons with the first spin S1 and the number of electrons with the second spin S2 is larger and thus a net current of electric charges is generated (a voltage is generated). Accordingly, a material including only a ferromagnetic substance is not used as the material of the spin orbit torque wiring layer 101.

Here, when a spin current of the first spin S1 is defined as $J_\uparrow$ and a spin current of the second spin S2 is defined as $J_\downarrow$, a spin current $J_S$ is defined as $J_S=J_\uparrow-J_\downarrow$. In FIG. 2, the spin current $J_S$ flows upward as a pure spin current in the drawing. Here, the spin current $J_S$ is expressed as a pure spin current with polarizability of 100%.

As illustrated in FIG. 1, when a ferromagnetic substance (the first ferromagnetic layer 102) is brought into contact with the top surface of the spin orbit torque wiring layer 101, the pure spin current diffuses and flows into the ferromagnetic substance (the spin is injected thereinto).

In the spin current magnetization reversing element 100 according to this embodiment, magnetization reversal of the first ferromagnetic layer 102 is caused due to a spin orbit torque (SOT) effect based on the pure spin current by causing a current to flow in the spin orbit torque wiring layer 101 to generate the pure spin current and causing the pure spin current to diffuse into the first ferromagnetic layer 102 in contact with the spin orbit torque wiring layer 101.

In view of efficiency of generation of a pure spin current, a material containing a heavy metal element having a d electron or an f electron at the outermost shell and having an atomic number of 39 or greater with a large spin orbit interaction (such as an alloy, an intermetallic compound, a metal boride, a metal carbide, a metal silicide, or a metal phosphide) can be preferably used as the material of the spin orbit torque wiring layer 101. When a current flows in a metal with a small atomic number, all internal electrons migrate in a reverse direction of a direction of a current regardless of the directions of the spins. On the other hand, when a current flows in a nonmagnetic metal with a large atomic number having a d electron or an f electron at the outermost shell, a spin orbit interaction occurs greatly, and thus a migrating direction of electrons depends on the spin directions due to the spin Hall effect and a pure spin current is likely to be generated.

The first insulating layer 103 contains at least boron nitride or aluminum nitride. The first insulating layer 103 can be formed, for example, by simultaneously sputtering boron nitride or aluminum nitride and other elements contained therein using an ion beam method.

When the first insulating layer 103 contains boron nitride as a major component, the first insulating layer 103 has slightly low insulation and is difficult to manufacture using general semiconductor processes. Boron nitride compounded at a low temperature or through a vapor deposition method is likely to have a disordered stacked structure and grows in grains, which causes a clearance between boron nitride grains, resulting in insufficient insulation. In order to manufacture dense boron nitride, a method of causing boron trichloride ($BCl_3$) and ammonia to react with each other at a high temperature or the like is known, but that reaction may cause magnetic characteristics of the magnetoresistance effect element to deteriorate. Particularly, there is concern that a nonmagnetic tunnel barrier layer causing a tunneling current in a TMR element will be chemically affected and thus output characteristics thereof will deteriorate remarkably.

It is possible to use the first insulating layer 103 containing boron nitride as a major component, but it is not generally used because of the above issues. Accordingly, it is preferable that the first insulating layer 103 additionally contain silicon nitride as a major component. In this case, the content by area percentage of boron nitride in the first insulating layer 103 preferably ranges from 3% to 30%. In the silicon nitride as the major component in the first insulating layer 103, the content by area percentage is preferably from 70% to 97% and more preferably from 75% to 90%.

When the content by area percentage of boron nitride is excessively high, insulating characteristics deteriorate and the first insulating layer does not function as an insulating layer of the spin orbit torque wiring layer 101. Accordingly, it is necessary to mainly bring surroundings of boron nitride grains into contact with silicon nitride, thereby maintaining sufficient insulating characteristics. The content by area percentage of boron nitride in the first insulating layer 103 can also be calculated from an area ratio of a part of the first insulating layer 103 containing boron and a part containing silicon by mapping a cross-section of the spin current magnetization reversing element 100 by energy-dispersive X-ray analysis (EDS).

In a case that the first insulating layer 103 contains the aluminum nitride as a major component, the first insulating layer 103 has excellent insulation and can be subjected to general semiconductor processes. Therefore, the first insulating layer 103 is formed by a film formation method such as a reactive ion beam sputtering using nitrogen gas or a metal organic chemical vapor deposition (MOCVD) using an aluminum nitride target.

The first insulating layer 103 containing silicon nitride as a major component can be formed, for example, by simultaneously sputtering silicon nitride and boron nitride using an ion beam method.

In the formed first insulating layer 103, a plurality of grains of boron nitride or aluminum nitride with a particle diameter of about 0.5 nm to 10 nm are formed in a film of silicon nitride as a major component and are almost uniformly distributed (scattered) in a direction substantially parallel to an interface 103a with the spin orbit torque wiring layer 101. In a direction substantially perpendicular to the interface 103a of the first insulating layer 103, the boron nitride grains can be distributed in at least the vicinity of (a range of about 5 nm from) the interface 103a with the spin orbit torque wiring layer 101 and may be distributed such that the centration of grains decreases continuously or stepwise farther from the interface 103a.

Since the first insulating layer 103 contains granular boron nitrides or aluminum nitride, the first insulating layer 103 can maintain a close contact with the spin orbit torque wiring layer 101 when heat treatment is performed and can prevent peeling of a film. This is because adhesiveness therebetween does not change much even when a temperature difference occurs between the spin orbit torque wiring layer 101 containing metal elements and the first insulating layer 103 due to a low thermal expansion ratio of boron nitride or aluminum nitride.

(Magnetoresistance Effect Element)

Figure 3:
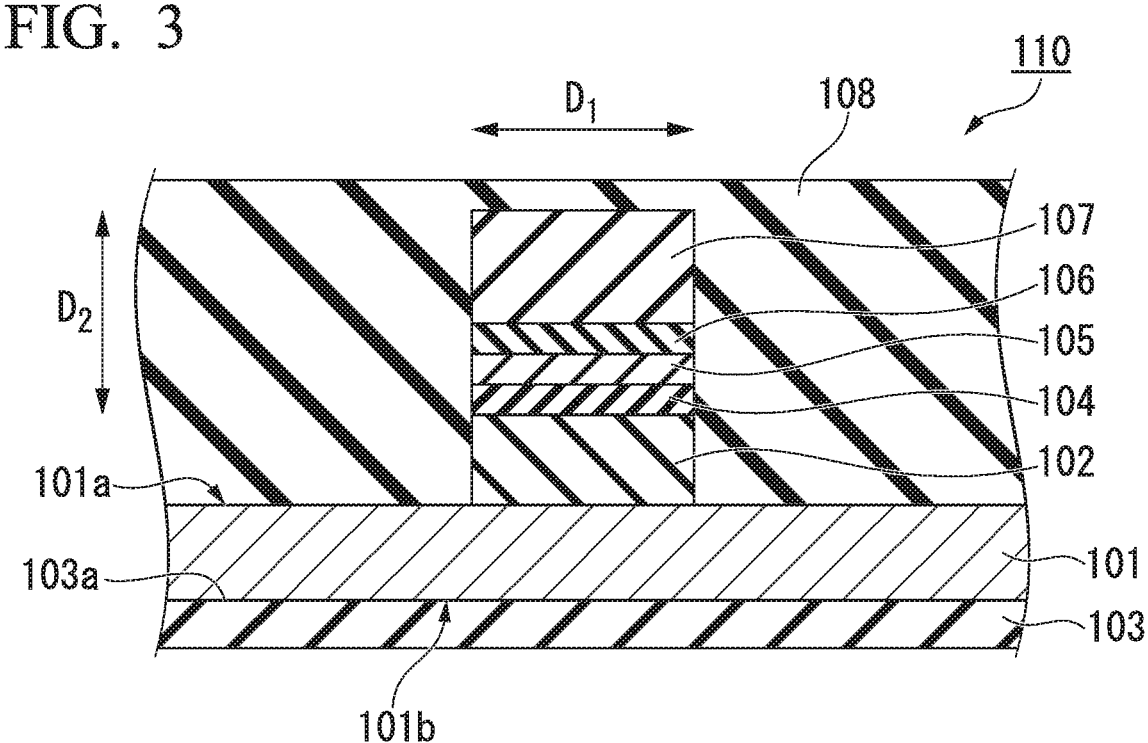
FIG. 3 is a sectional view schematically illustrating a configuration of a magnetoresistance effect element according to the first embodiment of the disclosure.

FIG. 3 is a sectional view schematically illustrating a configuration of a magnetoresistance effect element 110 according to this embodiment. The magnetoresistance effect element 110 has a structure in which at least a nonmagnetic layer 104 and a second ferromagnetic layer 105 are sequentially stacked on the first ferromagnetic layer 102 in the spin current magnetization reversing element 100 illustrated in FIG. 1. In the following description, the first ferromagnetic layer 102 will be referred to as a free layer in which a magnetization direction can be changed and the second ferromagnetic layer 105 will be referred to as a fixed layer in which a magnetization direction is fixed.

Known materials can be used for the nonmagnetic layer 104. For example, when the nonmagnetic layer 104 is formed of an insulator, $Al_2O_3$, $SiO_2$, MgO, and $MgAl_2O_4$ can be used as the material thereof. Materials in which some of Al, Si, or Mg is replaced with Zn, Be, or the like can be used in addition. Among these materials, MgO and $MgAl_2O_4$ are materials capable of realizing coherent tunneling and thus can efficiently inject spins. When the nonmagnetic layer 104 is formed of a metal, Cu, Au, Ag, or the like can be used as the material thereof.

The magnetoresistance effect element 110 corresponds to a tunneling magnetoresistance (TMR) element when the nonmagnetic layer 104 is formed of an insulator, and corresponds to a giant magnetoresistance (GMR) element when the nonmagnetic layer 104 is formed of a metal.

The second ferromagnetic layer 105 is formed of a known material (preferably a soft magnetic material) having ferromagnetism, for example, a metal selected from a group consisting of Cr, Mn, Co, Fe, and Ni and a ferromagnetic alloy containing one type of these metals. The second ferromagnetic layer 105 may be formed of an alloy (specifically, Co—Fe or Co—Fe—B) containing the metals and at least one type of element of B, C, and N.

In order to obtain a higher output, it is preferable that a Heusler alloy such as $Co_2FeSi$ be used. The Heusler alloy includes an intermetallic compound having a chemical composition of $X_2YZ$. Here, X is a transition metal element or a precious metal element in the Co, Fe, Ni, or Cu group, Y is a transition metal in the Mn, V, Cr, or Ti group or the same element as X, and Z is a typical element of Groups III to V. For example, $Co_2FeSi$, $Co_2MnSi$, or $Co_2Mn_{1-a}Fe_aAl_bSi_{1-b}$ can be used as the Heusler alloy.

By selecting a material having a larger coercive force than the material of the first ferromagnetic layer 102 as the material of the second ferromagnetic layer 105, the second ferromagnetic layer 105 is less likely to be reversed in magnetization than the first ferromagnetic layer 102. In this case, the second ferromagnetic layer 105 can be handled as a magnetization fixed layer and the first ferromagnetic layer 102 can be handled as a magnetization free layer.

When a material having the same coercive force as the material of the first ferromagnetic layer 102 is selected as the material of the second ferromagnetic layer 105, a pinning layer is formed on the surface or inside the second ferromagnetic layer 105 and magnetization of the second ferromagnetic layer 105 is fixed. Examples of the pinning layer include layers of antiferromagnetic materials such as IrMn and PtMn. The magnetization of the second ferromagnetic layer 105 is more strongly fixed by exchange coupling to the magnetization of the antiferromagnetic layer. Accordingly, in this case, the second ferromagnetic layer 105 is also less likely to be reversed in magnetization than the first ferromagnetic layer 102.

When the magnetization direction is set to be perpendicular to a stacked surface, it is preferable that the second ferromagnetic layer 105 be formed as a stacked film containing Co and Pt. Examples of a specific layer configuration thereof include [Co(0.24 nm)/Pt(0.16 nm)]6/Ru(0.9 nm)/[Pt (0.16 nm)/Co(0.16 nm)]4/Ta(0.2 nm)/FeB(1.0 nm). Here, numerical values in ( ) represent film thicknesses.

The second ferromagnetic layer 105 may be an in-plane magnetized film in which a magnetization direction is parallel to the surfaces of the layers or may be a vertically magnetized film in which a magnetization direction is perpendicular to the surfaces of the layers.

It is preferable that a cap layer 106 containing MgO or $AB_2O_4$ (where A is one of Mg and Zn and B is one of Al, Ga, and In) having a spinel structure be formed in a part on a side opposite to the nonmagnetic layer 104 (the top side of the second insulating layer 103 in FIG. 1) on the surface of the second ferromagnetic layer 105.

When the second ferromagnetic layer 105 is a vertically magnetized film, vertical magnetization is generated in an interface between the second ferromagnetic layer 105 and the nonmagnetic layer 104 by coupling between magnetic elements of the second ferromagnetic layer 105 and oxygen elements of the nonmagnetic layer 104. When the cap layer 106 is provided, vertical magnetization is also generated in an interface between the second ferromagnetic layer 105 and the cap layer 106 by coupling between magnetic elements of the second ferromagnetic layer 105 and oxygen elements of the cap layer 106. That is, the cap layer 106 serves to reinforce magnetization in the vertical direction (the stacking direction) $D_2$ of the second ferromagnetic layer 105.

A mask layer 107 including a heavy metal element such as Ta or an element having a high hardness such as TiN or TaN may be formed in a part on a side opposite to the second ferromagnetic layer 105 (the top side of the cap layer 106 in FIG. 1) on the surface of the cap layer 106. The mask layer 107 serves to protect the part which is left as a magnetoresistance effect element at the time of etching.

Since the mask layer 107 contains a heavy metal element, excessive etching thereof does not need to be considered unlike a resist which is easily etched, and thus the mask layer 107 can be formed in a smaller thickness. Accordingly, even when manufacturing is performed with an increased degree of integration of the magnetoresistance effect element, it is possible to avoid an influence of a shadow effect due to the mask layer at the time of etching. When the degree of integration of the magnetoresistance effect element does not need to be increased, a resist may be used for the mask layer.

The mask layer 107 containing a heavy metal element can easily absorb boron. Accordingly, for example, when the first ferromagnetic layer 102 and the second ferromagnetic layer 105 contain boron, it is possible to guide boron to the mask layer 107 and to prevent diffusion of boron into other parts.

The outer circumferential parts of the first ferromagnetic layer 102, the nonmagnetic layer 104, and the second ferromagnetic layer 105 may be covered with a second insulating layer 108. In this case, it is preferable that the second insulating layer 108 be formed of a film containing nitride such as SiN, TiN, TaN, NbN, or ZrN as a major component. In this case, the major component is means that an amount of nitride in the second insulating layer 108 is preferably from 70 mass % to 97 mass %.

An oxide in the cap layer 106 is likely to lose oxygen by an annealing process, and is likely to obtain oxygen from surrounding films when the surrounding films contain oxygen to compensate for the lost parts. As a result, electrical conductivity of the surrounding films from which oxygen is obtained is increased and electrical characteristics may depart from designed values. In this embodiment, since the second insulating layer 108 covering the outer circumferential portion of the cap layer 106 is formed of a film containing nitride as a major component, it is possible to avoid such a problem.

(Method of Manufacturing Magnetoresistance Effect Element)

An example of a method of manufacturing a magnetoresistance effect element 110 will be described below with reference to FIGS. 4A to 4C.

Figure 4A:
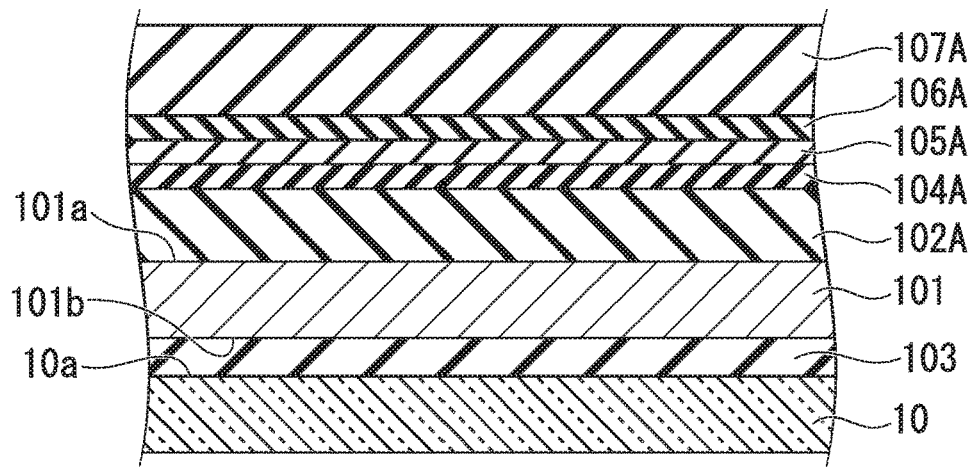
FIGS. 4A to 4C are sectional views of a processing object in the course of manufacturing a magnetoresistance effect element according to the first embodiment of the disclosure.

First, as illustrated in FIG. 4A, films 103A, 101A, 102A, 104A, 105A, 106A, and 107A constituting a first insulating layer, a spin orbit torque wiring layer, a first ferromagnetic layer, a nonmagnetic layer, a second ferromagnetic layer, a cap layer, and a mask layer are sequentially formed on one surface 10a of a substrate 10 using a known film-forming method such as a physical vapor deposition (PVD) method or a chemical vapor deposition (CVD) method. Examples of the physical vapor deposition method include a resistance heating vapor deposition method, an electron beam vapor deposition method, a molecular beam epitaxy (MBE) method, an ion plating method, an ion beam deposition method, and a sputtering method. Examples of the chemical vapor deposition method include a thermal CVD method, an optical CVD method, a plasma CVD method, an organic metal vapor deposition (MOCVD) method, and an atomic layer deposition (ALD) method. When the magnetoresistance effect element 110 is formed on a semiconductor element having a predetermined function, the semiconductor element serves as the substrate 10.

When a functional unit including the first ferromagnetic layer, the nonmagnetic layer, and the second ferromagnetic layer is used as a TMR element, the nonmagnetic layer serves as a tunnel barrier layer. The tunnel barrier layer is formed, for example, through the following procedure. First, by performing sputtering on the first ferromagnetic layer, a metal film containing magnesium, aluminum, and divalent cations of a plurality of nonmagnetic elements with a thickness of 0.4 nm to 2.0 nm is first formed. Subsequently, plasma oxidization or natural oxidization by introduction of oxygen is performed and then heat treatment is performed, whereby the tunnel barrier layer is obtained.

Since a layer which is formed by reactive sputtering is amorphous and needs to be crystallized, the obtained functional unit is preferably subjected to an annealing process.

The functional unit obtained by performing the annealing process has a higher magnetoresistance ratio than a functional unit obtained by not performed the annealing process. This is because uniformity in crystal size and orientation of the nonmagnetic layer (the tunnel barrier layer) are improved by the annealing process.

In the annealing process, the functional unit is heated at a temperature of 300° C. to 500° C. in an inert atmosphere of Ar or the like for a time of five minutes to 100 minutes and then is heated at a temperature of 100° C. to 500° C. for a time of one hour to 10 hours in a state in which a magnetic field of 2 kOe to 10 kOe is applied thereto.

Figure 4B:
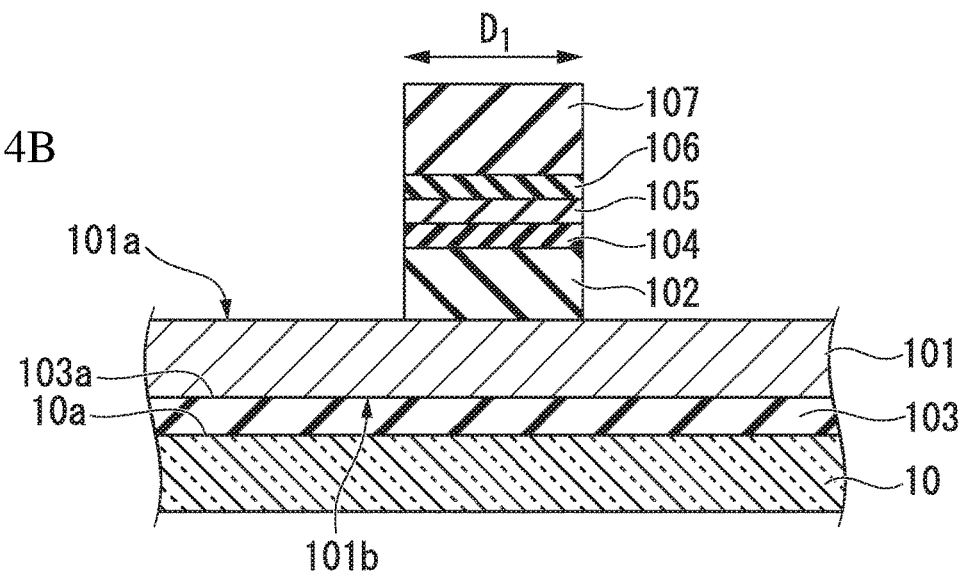

Then, as illustrated in FIG. 4B, the formed five films 102A, 104A, 105A, 106A, and 107A are processed in a desired shape by removing unnecessary parts using a photolithography method, an ion milling method, a reactive ion etching (RIE) method, or the like.

Figure 4C:
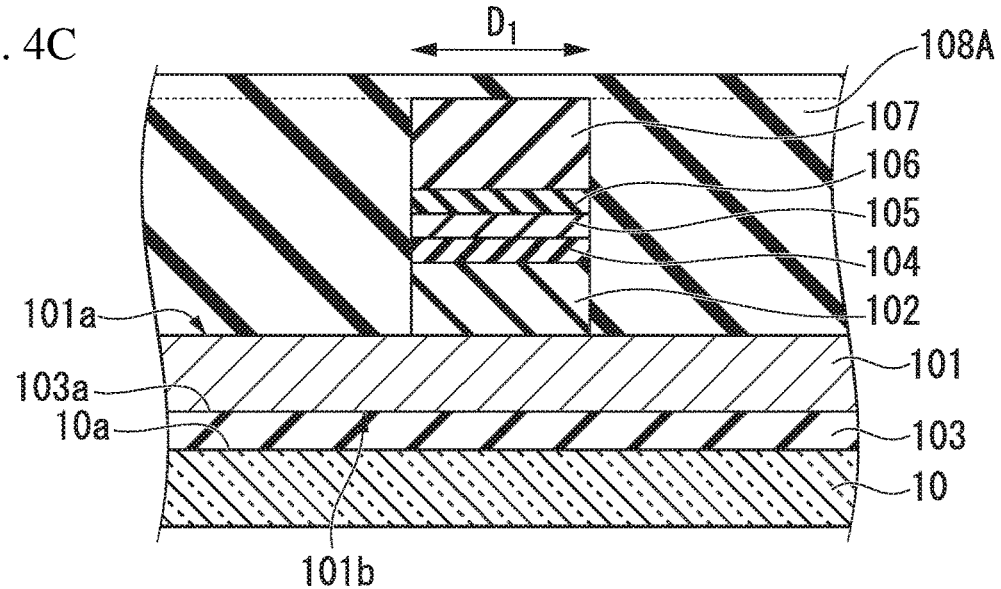

Then, as illustrated in FIG. 4C, the second insulating layer 108 containing silicon nitride as a major component is formed to cover exposed parts of the spin orbit torque wiring layer 101, the first ferromagnetic layer 102, the nonmagnetic layer 104, the second ferromagnetic layer 105, the cap layer 106, and the mask layer 107 using a CVD method. Through this process, the second insulating layer containing silicon nitride as a major component is formed on one surface other than a second surface of the spin orbit torque wiring layer.

The outermost surface of the formed second insulating layer 108 is flattened by performing a chemical-mechanical polishing (CMP) process. The CMP process may be performed on the outermost surface of the second insulating layer 108 until the mask layer 107 is exposed (up to a position indicated by a dotted line in FIG. 4C, but may be stopped in a state in which silicon nitride film remains on the mask layer 107.

Through the above-mentioned processes, it is possible to obtain a magnetoresistance effect element 110 according to this embodiment. The substrate 10 which has been used herein may be removed or may be left depending on applications of the magnetoresistance effect element 110.

(Magnetic Memory)

The magnetoresistance effect element 110 can operate as a magnetic memory on which reading and writing of data is performed using characteristics in which element resistance varies depending on an angle formed by the magnetization direction of the first ferromagnetic layer 102 and the magnetization direction of the second ferromagnetic layer 105. In this case, a semiconductor element that causes the magnetic memory and peripheral circuits thereof to operate is preferably formed on the first insulating layer 103 side (the bottom side of the first insulating layer 103 in FIG. 3) in view of improvement in a degree of integration.

Figure 5:
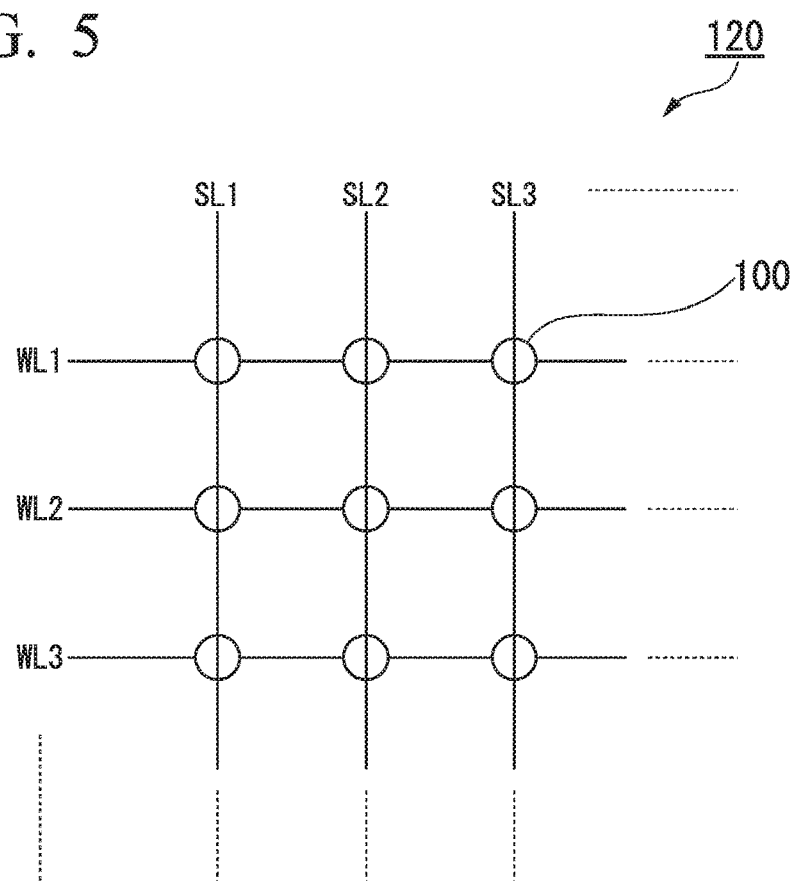
FIG. 5 is a plan view schematically illustrating a configuration of a magnetic memory according to the first embodiment of the disclosure.

As illustrated in FIG. 5, in a magnetic memory 120, wiring layers on one side of the magnetoresistance effect element 110 are connected by source lines (bit lines) SL1, SL2, SL3, ... and wiring layers on the other side thereof are connected by word lines WL1, WL2, WL3, .... By mounting a plurality of magnetic memories as a built-in memory on an LSI substrate, it is possible to obtain a magnetic device in which an influence of delay which is proportional to a distance between the magnetoresistance effect elements 110 has been reduced.

As described above, in this embodiment, a part of the surface of the spin orbit torque wiring layer constituting a spin current magnetization reversing element is covered with a first insulating film of which heat dissipation ability has been improved by containing boron nitride. Accordingly, even when a large current flows in the spin orbit torque wiring layer, it is possible to efficiently discharge heat generated with the current to the outside via the first insulating film. According to this embodiment, it is possible to provide a spin current magnetization reversing element, a magnetoresistance effect element, a magnetic memory, and a magnetic device that have a structure in which deterioration of characteristics due to emission of heat is not easily caused.

Modified Example 1

Figure 6:
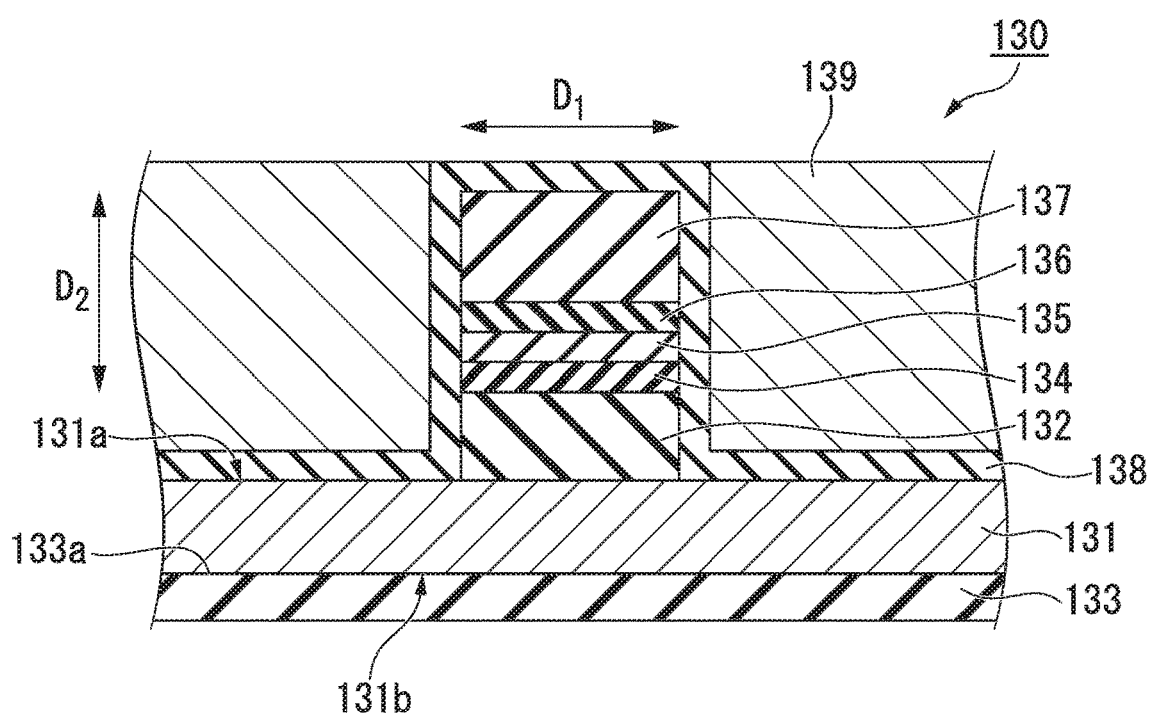
FIG. 6 is a perspective view schematically illustrating a configuration of a spin current magnetization reversing element according to Modified Example 1 of the first embodiment of the disclosure.

FIG. 6 is a perspective view schematically illustrating a configuration of a spin current magnetization reversing element 130 according to Modified Example 1 of the embodiment.

In the spin current magnetization reversing element 100 according to the embodiment, since heat conduction in the second insulating layer 108 is based on only lattice vibration, heat dissipation ability of the second insulating layer 108 itself is low. On the other hand, in the spin current magnetization reversing element 130 according to Modified Example 1, a second insulating layer 138 is formed in a small thickness as long as insulation can be maintained, a heat-dissipating layer 139 formed of a metallic material such as metal nitride is formed thereon, and thus a structure with high heat dissipation ability is provided.

In the heat-dissipating layer 139 containing the metal nitride as a major component, the content by area percentage of the metal nitride is preferably from 70% to 100% and more preferably from 75% to 97%. Furthermore, one of silicon nitride and aluminum nitride is used as the metal nitride.

The shape, size, and the like of the heat-dissipating layer 139 are not particularly limited, but the area covering the second insulating layer 138 is preferably as large as possible in view of an increase in an amount of heat dissipated. The configuration other than the heat-dissipating layer 139 is the same as the configuration of the spin current magnetization reversing element 100.

EXPLANATION OF REFERENCES 100, 130 Spin current magnetization reversing element
101, 131 Spin orbit torque wiring layer
101a, 131a First surface
101b, 131b Second surface
102, 132 First ferromagnetic layer
103, 133 First insulating layer
103a, 133a Interface
104, 134 Nonmagnetic layer
105, 135 Second ferromagnetic layer
106, 136 Cap layer
107, 137 Mask layer
108, 138 Second insulating layer
110 Magnetoresistance effect element
120 Magnetic memory
139 Heat-dissipating layer
$D_1$ Extending direction
$D_2$ Stacking direction

What is claimed is:

1. A magnetoresistance effect element, comprising:
   a spin orbit torque wiring layer that extends in one direction;
   a first ferromagnetic layer that is on a first surface of the spin orbit torque wiring layer;
   a first insulating layer that is on a second surface of the spin orbit torque wiring layer, the second surface being on a side opposite to the first surface;
   a second insulating layer that is on the first surface excluding the first surface contacting with the first ferromagnetic layer;
   a heat-dissipating layer that is on a part of a surface of the second insulating layer;
   a nonmagnetic layer; and
   a second ferromagnetic layer, wherein:
   the nonmagnetic layer and the second ferromagnetic layer are on a side of the first ferromagnetic layer opposite to the spin orbit torque wiring layer;
   the first insulating layer contains silicon nitride and a plurality of grains of boron nitride with a particle diameter of 0.5 nm to 10 nm;
   in the first insulating layer, area percentage of the silicon nitride is 70% to 97% and area percentage of the boron nitride is 3% to 30%, and
   the plurality of grains of boron nitride are distributed in the first insulating layer in a direction parallel to an interface with the spin orbit torque layer.

2. The magnetoresistance effect element according to claim 1, wherein the second insulating layer contains silicon nitride as a major component.

3. The magnetoresistance effect element according to claim 1, wherein the heat-dissipating layer contains a metal nitride as a major component.

4. The magnetoresistance effect element according to claim 1, wherein a cap layer containing MgO or $AB_2O_4$ (A=Mg or Zn, B=Al, Ga, or In) having a spinel structure is provided on a surface of the second ferromagnetic layer on a side of the second ferromagnetic layer opposite to the nonmagnetic layer.

5. The magnetoresistance effect element according to claim 1, further comprising a semiconductor element formed on a surface of the first insulating layer on a side of the first insulating layer opposite to the spin orbit torque wiring layer.

6. A magnetic memory comprising the magnetoresistance effect element according to claim 1.

7. A magnetic device comprising an LSI substrate, wherein the magnetic memory according to claim 6 is mounted as a built-in memory in the LSI substrate.

8. The magnetoresistance effect element according to claim 1, further comprising a cap layer that is formed on a surface of the second ferromagnetic layer on a side of the second ferromagnetic layer opposite to the nonmagnetic layer.

9. The magnetoresistance effect element according to claim 8, further comprising a mask layer that is formed on a surface of the cap layer on a side of the cap layer opposite to the second ferromagnetic layer.

10. A magnetoresistance effect element, comprising:
- a spin orbit torque wiring layer that extends in one direction;
- a first ferromagnetic layer that is on a first surface of the spin orbit torque wiring layer;
- a first insulating layer that is on a second surface of the spin orbit torque wiring layer, the second surface being on a side opposite to the first surface;
- a second insulating layer that is on the first surface excluding the first surface contacting with the first ferromagnetic layer;
- a heat-dissipating layer that is on part of a surface of the second insulating layer;
- a nonmagnetic layer stacked on the first ferromagnetic layer;
- a second ferromagnetic layer stacked on the nonmagnetic layer; and
- a cap layer that is formed on a surface of the second ferromagnetic layer on a side of the second ferromagnetic layer opposite to the nonmagnetic layer, wherein the nonmagnetic layer and the second ferromagnetic layer are on a side of the first ferromagnetic layer opposite to the spin orbit torque wiring layer, the first insulating layer contains a plurality of grains of boron nitride or aluminum nitride with a particle diameter of 0.5 nm to 10 nm, the plurality of grains of boron nitride or aluminum nitride are distributed in the first insulating layer in a direction parallel to an interface with the spin orbit torque wiring layer, the second ferromagnetic layer is a vertically magnetized film, and the cap layer contains $AB_2O_4$ having a spinel structure, where in A is one of Mg and Zn and B is one of Al, Ga, and In.

* * * * *